United States Patent
Stein et al.

(10) Patent No.: US 7,124,043 B2
(45) Date of Patent: Oct. 17, 2006

(54) SPECTRUM ANALYZER WITH PHASE NOISE COMPENSATION

(75) Inventors: Anatoli B. Stein, Atherton, CA (US); Serguei Pantchenko, Scott's Valley, CA (US)

(73) Assignee: Guzik Technical Enterprises, Mountain View, CA (US)

(*) Notice: Subject to any disclaimer, the term of this patent is extended or adjusted under 35 U.S.C. 154(b) by 0 days.

(21) Appl. No.: 10/945,118

(22) Filed: Sep. 20, 2004

(65) Prior Publication Data

US 2006/0064260 A1    Mar. 23, 2006

(51) Int. Cl.
*G01R 23/16* (2006.01)

(52) U.S. Cl. .................. 702/76; 702/69; 702/106; 324/76.19; 324/76.22

(58) Field of Classification Search .............. None
See application file for complete search history.

(56) References Cited

U.S. PATENT DOCUMENTS

| | | | |
|---|---|---|---|
| 4,918,748 A | 4/1990 | Shahriary et al. | 455/315 |
| 6,166,533 A * | 12/2000 | Musha | 324/76.27 |
| 6,313,619 B1 * | 11/2001 | Roth | 324/76.19 |
| 6,600,906 B1 | 7/2003 | Roppongi | 455/118 |
| 6,621,277 B1 * | 9/2003 | Mar | 324/622 |

* cited by examiner

*Primary Examiner*—Marc S. Hoff
*Assistant Examiner*—Manuel L Barbee
(74) *Attorney, Agent, or Firm*—Mark G. Lappin; Greenberg Traurig LLP (57) ABSTRACT

A spectrum analyzer with a compensation circuitry for prevention of measurement accuracy deterioration due to local oscillators phase noise.

12 Claims, 9 Drawing Sheets

a) First local oscillator b) Second local oscillator c) Output of BPF 300 d) Input of the spectrum analyzer e) Output of BPF 201 f) Output of BPF 203

SPECTRUM ANALYZER WITH PHASE NOISE COMPENSATION

FIELD OF THE INVENTION

The present invention relates to spectrum analyzers that analyze the frequency spectrum of an incoming signal and display the spectrum on a frequency domain display. In particular, this invention relates to means for preventing measurement accuracy deterioration in spectrum analyzers that use local oscillators with substantial level of phase noise.

BACKGROUND OF THE INVENTION

Figure 1:
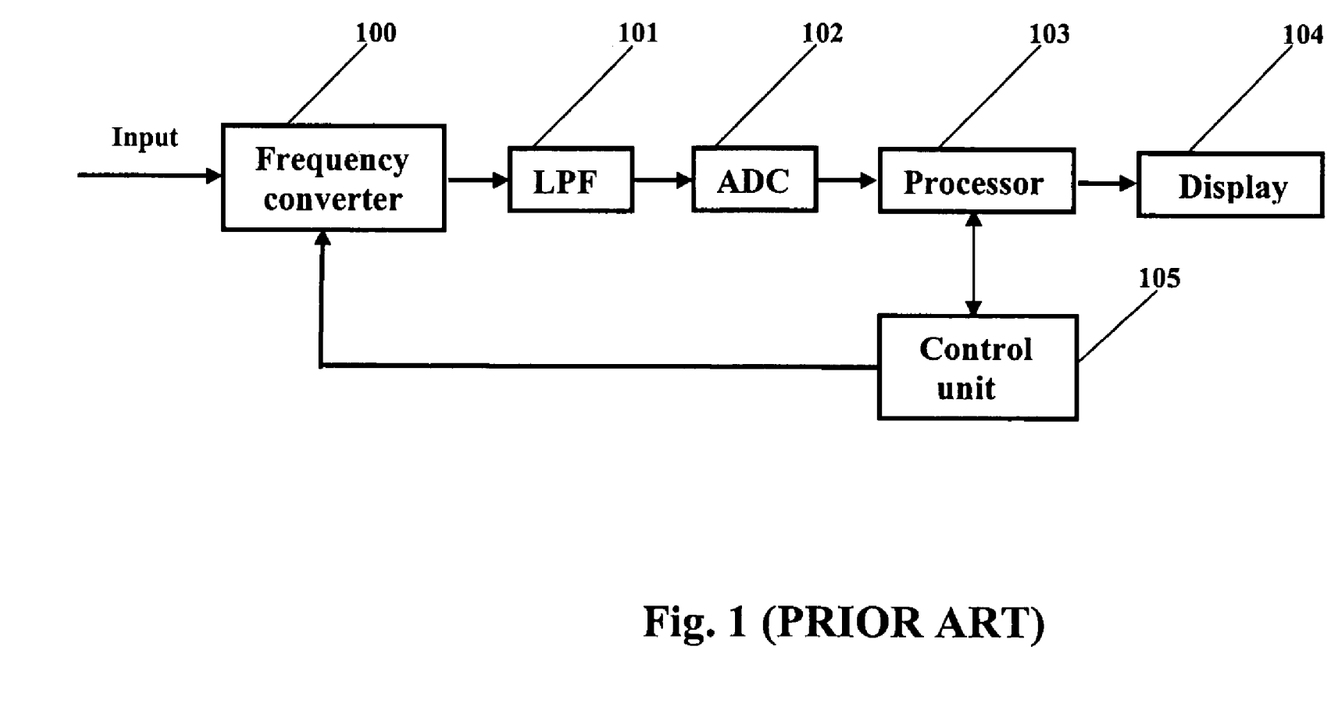
FIG. 1 is a block diagram of a prior art spectrum analyzer.

A spectrum analyzer is a device that measures the power density of an input signal and displays that power density in a form convenient to the user. A typical block diagram of a prior art spectrum analyzer is shown in FIG. 1. The spectrum analyzer of FIG. 1 includes a frequency converter 100, a low pass filter (LPF) 101, an analog-to-digital converter (ADC) 102, a processor 103, a display 104 and a control unit 105. The frequency spectrum of an applied input signal is measured in a step-by-step process. The control unit 105 controls the frequency converter 100 and, in particular, specifies at each step, a frequency band Fst . . . Fst+$\Delta$F of the input signal spectrum that is to be currently analyzed (Fst is the start frequency of the band to be analyzed, and $\Delta$F is the spacing between adjacent start frequencies). The frequency converter 100 transfers the band Fst . . . Fst+$\Delta$F to the band 0 . . . $\Delta$F. An anti-aliasing low pass filter (LPF) 101 suppresses all components with the frequencies higher than Fs/2 (where Fs is the sampling rate). The analog to digital converter (ADC) 102 transforms an incoming continuous signal into a sequence of digital samples with the sampling rate Fs. The processor 103 carries out a Fast Fourier Transform of the signal that comes from the next frequency band at each next step of the spectrum measurement. Then, processor 103 concatenates the resulting partial spectrum pieces into an aggregate spectrum of the input signal and transfers the resulting spectrum to the display 104, interacting all the time with the control unit 105.

One of the essential conditions that should be met to achieve a high measurement accuracy in a spectrum analyzer, is a requirement for the frequency converter 100 not to create spurious responses, which may substantially distort the final picture. To attain such a purpose, a conventional frequency converter usually contains several conversion stages with an appropriate selection of intermediate frequencies and frequencies of local oscillators. As an example, a prior art spectrum analyzer with a three-stage frequency converter is shown in FIG. 2.

Figure 2:
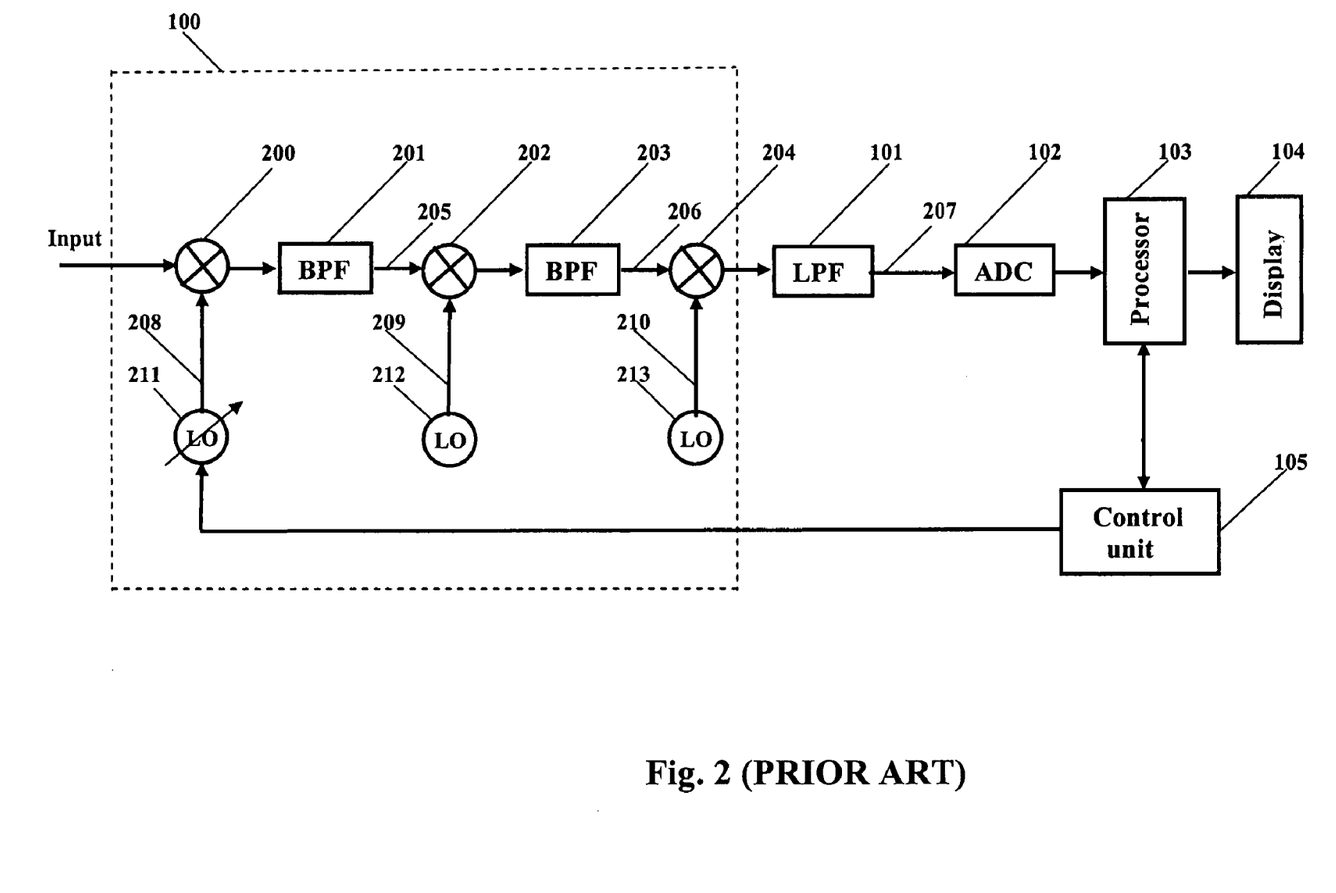
FIG. 2 is a block diagram of a prior art spectrum analyzer with a three-stage frequency converter.

In the spectrum analyzer of FIG. 2, the first stage of the frequency converter 100 is formed by a first mixer 200, a first band pass filter (BPF) 201 and a first local oscillator (LO) 211. The second stage of frequency converter 100 is formed by a second mixer 202, a second band pass filter 203 and a second local oscillator 212. The third stage of frequency converter 100 is formed by a third mixer 205 and a third local oscillator 213.

The first local oscillator 211 is a variable frequency oscillator with a frequency that is controlled by the control unit 105. The second local oscillator 212 and third local oscillator 213 are fixed frequency oscillators. The frequencies $F_1$ of the first local oscillator 211, and $F_2$ of the second local oscillator 212, are substantially higher than the frequency $F_3$ of the third local oscillator 213.

In operation, the input signal of the spectrum analyzer of FIG. 2 is mixed with the first local signal 208 by the first mixer 200, so that signals having both sum and difference frequencies of the first local signal 208 and the input signal are produced. The first band pass filter 201 selects the difference signal creating the first intermediate frequency (IF) signal 205.

The first IF signal 205 is provided to the second mixer 202, where it is mixed with the second local signal 209. The second mixer 202 produces signals having both sum and difference frequencies of the first IF signal 205 and second local signal 209. The second band pass filter 203 selects the difference signal creating the second IF signal 206.

Similarly, the second IF signal 206 is provided to the third mixer 204 where it is mixed with the third local signal 210. The third mixer 204 produces signals having both sum and difference frequencies of the second IF signal 206 and third local signal 210. Low pass filter 101 selects the difference signal, creating ADC input signal 207.

At each next step of spectrum measurement with the start frequency Fst, control unit 105 sets the frequency $F_1$ of the first local oscillator to equal $F_1$=Fst+$F_2$+$F_3$. If the input signal has a frequency Fin, then the first IF signal 205 has a frequency $F_1$–Fin, the second IF signal 206 has a frequency $F_1$–Fin–$F_2$ and the ADC input signal 207 has a frequency $F_3$–($F_1$–Fin–$F_2$)=$F_3$–$F_1$+Fin+$F_2$=$F_3$–(Fst+$F_2$+$F_3$)+Fin+$F_2$=Fin–Fst. Thus, the frequency band Fst . . . Fst+$\Delta$F of the input signal is transferred by the frequency converter 100 to the frequency band 0 . . . $\Delta$F at the ADC input.

The frequency converter 100, shown in FIG. 2, carries out the necessary frequency transfer without producing harmful spurious components. However, in order to provide the high sensitivity and resolution for the spectrum analyzer that are needed to achieve a desired measurement accuracy, the frequency converter should possess one more quality: any phase noise that is introduced in the processed signal has to be correspondingly small.

The phase noise manifests itself as unwanted random fluctuations in a relative phase of a signal. The phase noise originates in the local oscillators of the frequency converter and finds its way into processed signal during the mixing operations. The phase noise level of a local oscillator grows when the oscillator frequency is relatively high. Therefore, the main sources of the phase noise in the block diagram of FIG. 2 are the first local oscillator 211 (especially when it includes either a yttrium-iron-garnet (YIG) transistor or a gallium-arsenide field effect transistor (GaAs FET) oscillator, as often is the case) and the second local oscillator 212. The third local oscillator 213 is usually a crystal oscillator with high frequency stability and very low level of phase noise. The phase noise of the first local oscillator 211 is $\theta_1(t)$, the phase noise of the second local oscillator 212 is $\theta_2(t)$, and the input signal and the third local oscillator are substantially free of phase noise. Then the phase noise of the first IF signal 205 is $\theta_1(t)$, whereas phase noise of the second IF signal 206 and phase noise of the signal 207 at the ADC input is $\theta_1(t)$–$\theta_2(t)$.

Figure 3:
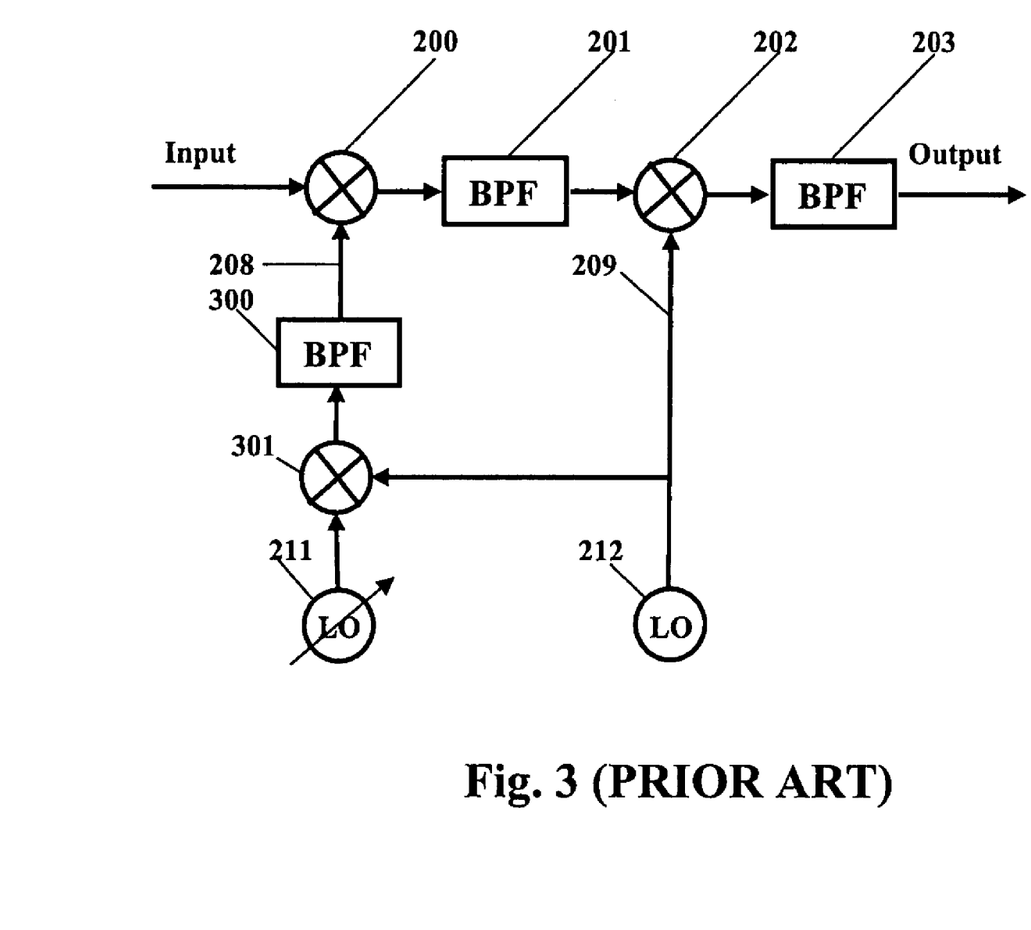
FIG. 3 is a block diagram of a prior art frequency converter with phase noise compensation.

In the prior art, different methods of phase noise suppression are used in communication receivers, measuring devices and so on. One efficient approach consists of impressing the phase noise of a noisy oscillator onto a clean oscillator. Then during the mixing operations, phase noise of the first oscillator is added and phase noise of the second oscillator is subtracted from the processed signal phase. As a result, the output signal is free of the phase noise developed in the first oscillator. Such an approach was employed, for example, in U.S. Pat. No. 4,918,748, U.S. Pat. No. 6,313,619 and U.S. Pat. No. 6,600,906. The block diagram described in U.S. Pat. No. 6,600,906 is shown in FIG. 3. In this patent the second local oscillator 210 is supposed to have high level of phase noise. The first local oscillator 209 is taken as having a lower frequency and a small phase noise. The passage of signals in the FIG. 3 is basically the same as in first two stages of frequency converter 100 in the spectrum analyzer of FIG. 2. The distinction is that first local signal 208 is produced in FIG. 3 not by an independent local oscillator 211, but by mixing signals from the first local oscillator 211 and the second local oscillator 212 in the mixer 301 with the subsequent selection of the sum component by BPF 300. Thanks to such device structure the phase noise in the first 208 and the second 209 local signals are essentially the same. In the mixer 200 the phase noise of the first local signal is added to the processed signal and in the mixer 202 the phase noise of the second local signal is subtracted from the processed signal. Thus, in the mixer 202 a mutual cancellation of the phase noise of the IF signal and the phase noise of second local signal occurs. The resulting output signal has a small level of residual phase noise. In an example presented in said patent, the frequency of the input signal lies in the range from 10 MHz to 2.9 GHz, the frequency of the first local oscillator 209 varies from 505 MHz to 3.395 GHz and the frequency of the second local oscillator 210 equals 3.6 GHz. The frequency of the signal at the output of the BPF 300 equals the sum of the frequencies of the first local oscillator 209 and the second local oscillator 210. When the frequency of the first local oscillator 209 varies from 505 MHz to 3.395 GHz, the frequency of the signal at the output of the BPF 300 is changed from 4.105 GHz to 6.995 GHz. The BPF 300 should pass all frequencies from the mentioned range and suppress the frequencies bellow 4.105 GHz. BPF 201 passes frequencies in the neighborhood of 4.095 GHz. The output signal has a frequency 495 MHz.

Figure 4:
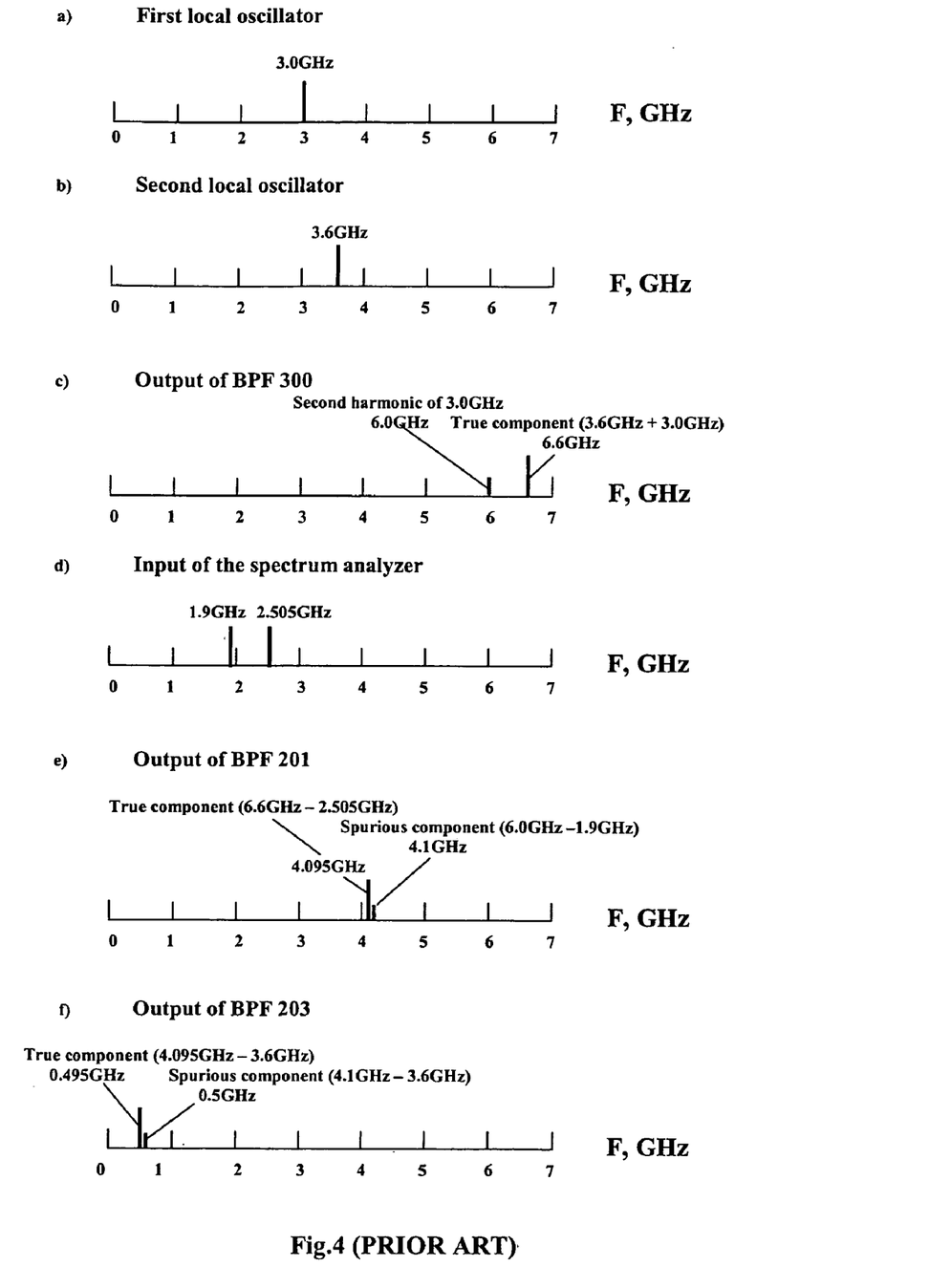
FIG. 4 illustrates the appearance of spurious responses in a prior art frequency converter with phase noise compensation.

The most important reason that prevents the use of the outlined method of the phase noise suppression in a spectrum analyzer, is the appearance of numerous spurious components in the processed signal. In the context of previous example let us suppose that the frequency of the first local oscillator 211 is set up equal to 3.0 GHz (see FIG. 4). The frequency of the second local oscillator 212 is fixed and equal to 3.6 GHz. After mixing in mixer 301 and selection in BPF 300, the true first local signal 208 is created with the frequency 3.0 GHz+3.6 GHz=6.6 GHz. However, due to inevitable non-linearity in the mixer 301, a second harmonic of the first local oscillator signal with the frequency 6.0 GHz appears at the output of the mixer 301 as well. After passing through BPF 300, it appears as a false component of the first local signal 208 at the input of the mixer 200 (FIG. 4c). Since the passband of the BPF 300 inevitably embraces the range 4.105–6.995 GHz, the true component 6.6 GHz cannot be separated from the false one 6.0 GHz by filtering. Let the input signal of the spectrum analyzer have frequency components of 1.9 GHz and 2.505 GHz. The frequency component 2.505 GHz passes the first mixer 200 and the BPF 201, appearing in the first intermediate signal 205 as a component with a frequency 6.6 GHz–2.505 GHz=4.095 GHz. The frequency component 1.9 GHz interacts in the mixer 200 with the second harmonic 6.0 GHz and causes the appearance of the component with the frequency 6.0 GHz–1.9 GHz=4.1 GHz (FIG. 4e). After frequency conversion in the mixer 202 and BPF 203 a true component 0.495 GHz and a false component 0.5 GHz are produced (FIG. 4f). In this way, a by-product satellite that is unavailable in the input signal of the spectrum analyzer appears near the true component. The results of the spectrum measurements become contrary to fact and that cannot be tolerated.

As evidenced by forgoing discussion, a spectrum analyzer that carries out suppression of the phase noise of the local oscillators and, at the same time, does not create spurious responses in the processed signal would be an significant improvement in the art.

SUMMARY OF THE INVENTION

It is an object of the present invention to provide a spectrum analyzer with suppression of the phase noise of the local oscillators and without creating any spurious responses.

It is another object of the present invention to provide a spectrum analyzer with suppression of the phase noise of the local oscillators and without too stringent requirement to the filter selectivity factor that may make difficult or impossible the filters manufacturing.

It is a further object of the present invention to provide a spectrum analyzer where incomplete compensation of the phase noise is precluded.

In order to accomplish the first object of the present invention, a phase noise compensation unit is incorporated in a spectrum analyzer having a three stage frequency converter at its input. Two signal inputs of the phase noise compensation unit are connected to the outputs of the first local oscillator and the second local oscillator. The control input of the phase noise compensation unit is connected to the output of the control unit of the spectrum analyzer. The output of the phase noise compensation unit is connected to the input of the third mixer of the frequency converter. The phase noise compensation unit processes the first and the second local signals that are applied to its signal inputs with the use of the information about current start frequency which is received through the control input. The phase noise compensation unit produces at its output a signal that has a frequency equal to the desired frequency of the third local signal. The phase noise of this signal is made equal to the difference $\theta_1(t)-\theta_2(t)$, where $\theta_1(t)$ is the phase noise of the first local oscillator of the frequency converter and $\theta_2(t)$ is the phase noise of the second local oscillator. At the same time the phase noise compensation unit ensures that its output signal is free from any spurious responses.

The second IF signal of the frequency converter contains the same phase noise $\theta_1(t)-\theta_2(t)$. The third mixer of the frequency converter mixes the second IF signal and the third local signal. During this process phase noise of the second IF signal and phase noise, inserted in the third local signal, cancel each other. Therefore, the resulting signal that comes to the input of the ADC, has a negligibly small phase noise.

The first and the second local signals are applied to the first and the second mixers from the first and the second local oscillators directly, so that they do not have spurious responses. The third local signal does not have spurious responses thanks to the precautions, which are taken in the phase noise compensation unit. Hence, the resulting signal that comes to the input of the ADC, is free of any spurious responses as well.

According to the present invention the phase noise compensation unit consists of a first auxiliary frequency converter, a second auxiliary frequency converter and a reference oscillator. The first auxiliary frequency converter processes the first and the second local signals, creating a signal that has a phase noise $\theta_1(t)-\theta_2(t)$. The reference oscillator at each step of spectrum measurement generates under control from the control unit a signal with a frequency that equals the start frequency. The second auxiliary frequency converter uses the output signals of the first auxiliary frequency converter and the reference oscillator to produce the third local signal with the desired frequency and with the same phase noise $\theta_1(t)-\theta_2(t)$. Simultaneously, the second auxiliary frequency converter removes from the output signal all spurious components that could appear during the mixing operations.

According to the present invention, each of the two auxiliary frequency converters includes a mixer in series with a filter. Such an assembly produces an output signal that has a frequency, equal to the difference of the frequencies of the two input signals.

In order to accomplish the second object of the present invention, the phase noise compensation unit is complemented by a third auxiliary frequency converter that has an input and an output. The input of the third auxiliary frequency converter is connected to the output of the phase noise compensation unit. The output of the third auxiliary frequency converter is connected to the input of the third mixer of the frequency converter. The third auxiliary frequency converter comprises a mixer, a band pass filter and a third local oscillator. It creates at its output, a signal with a frequency that equals the sum of the frequency of the input signal and the frequency of the third local oscillator. The first input of the mixer is used as the input of the third auxiliary frequency converter, the second input of the mixer is connected to the output of the third local oscillator. The output of the mixer is connected to the input of the band pass filter. The output of the band pass filter is used as the output of the third auxiliary frequency converter.

In order to accomplish the third object of the present invention, a delay line is inserted in the path of the processed signal in the frequency converter before the third stage of conversion.

DETAILED DESCRIPTION OF THE PREFERRED EMBODIMENT

Figure 5:
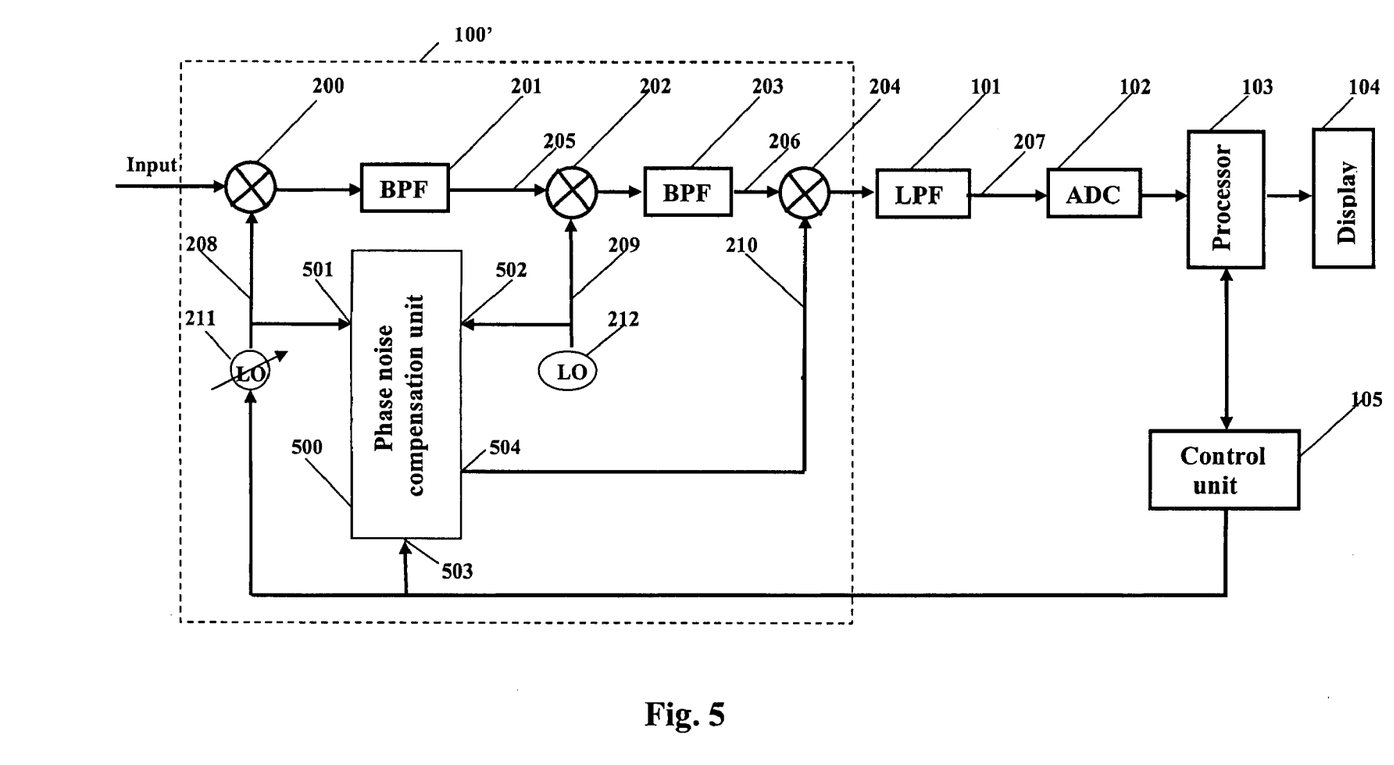
FIG. 5 is a block diagram of a spectrum analyzer according to the present invention.

A block diagram of a basic embodiment of a spectrum analyzer according to the present invention is shown at FIG. 5. In FIG. 5, the frequency converter 100' differs from that in FIG. 1, but the remaining blocks 101, 102, 103, 104, and 105 can be similar to the correspondingly numbered blocks in FIG. 1. The frequency converter 100' includes a first mixer 200, a first band pass filter (BPF) 201, a second mixer 202, a second band pass filter (BPF) 203, a third mixer 204, the first local (variable frequency) oscillator 211 and the second (fixed frequency) local oscillator 212, all similar to correspondingly numbered elements in FIG. 2.

A phase noise compensation unit 500 is incorporated in the frequency converter 101' of spectrum analyzer. Two signal inputs 501 and 502 of the phase noise compensation unit 500 are connected to the outputs of the first local oscillator 211 and the second local oscillator 212 respectfully. A control input 503 of the phase noise compensation unit 500 is connected to the output of the control unit 105. The output 504 of the phase noise compensation unit 500 is connected to the input of the third mixer 204. The phase noise compensation unit 500 processes the first local signal 208 and the second local signal 209 with the use of the information about current start frequency Fst received through the control input 503. As a result, an output signal 504 is produced, this signal having a frequency equal to the desired frequency of the third local signal 210. The phase noise compensation unit 500 inserts in the output signal 504 a phase noise that equals the difference $\theta_1(t)-\theta_2(t)$ between the phase noise $\theta_1(t)$ of the first local oscillator 211 and the phase noise $\theta_2(t)$ of the second local oscillator 212. What is most important, the phase noise compensation unit 500 produces the signal 504 free of any spurious components In the first mixer 200 and the first BPF 201, the frequency of the input signal is subtracted from the frequency of the first local signal 208. Therefore, the phase noise of the first intermediate signal 205 is the same as phase noise $\theta_1(t)$ of the first local oscillator 211. In the second mixer 202 and the second BPF 203, the frequency of the second local signal 209 is subtracted from the frequency of the first intermediate signal 205. This being so, the phase noise of the second intermediate signal 206 equals the difference $\theta_1(t)-\theta_2(t)$ between the phase noise $\theta_1(t)$ of the first local oscillator and the phase noise $\theta_2(t)$ of the second local oscillator. Thus, the phase noise of the second intermediate signal 206 and the phase noise inserted by the phase noise compensation unit 500 in the third local signal 210 are the same. In the third mixer 204 and LPF 101 the phase noise of the third local signal 210 is subtracted from the phase noise of the second intermediate signal 206. As a result a mutual cancellation of the phase noises takes place, so that the signal 207 at the input of the ADC 102 has a negligibly small phase noise.

In the block diagram of FIG. 5, the first local signal 208 and the second local signal 209 are directly applied to the respective first and the second mixers; consequently they are free from spurious responses. The third local signal 210 is free from spurious responses thanks to the precautions that are taken in the phase noise compensation unit 500. Therefore, the resulting signal that comes to the ADC input 207 is free of any spurious responses.

Figure 6:
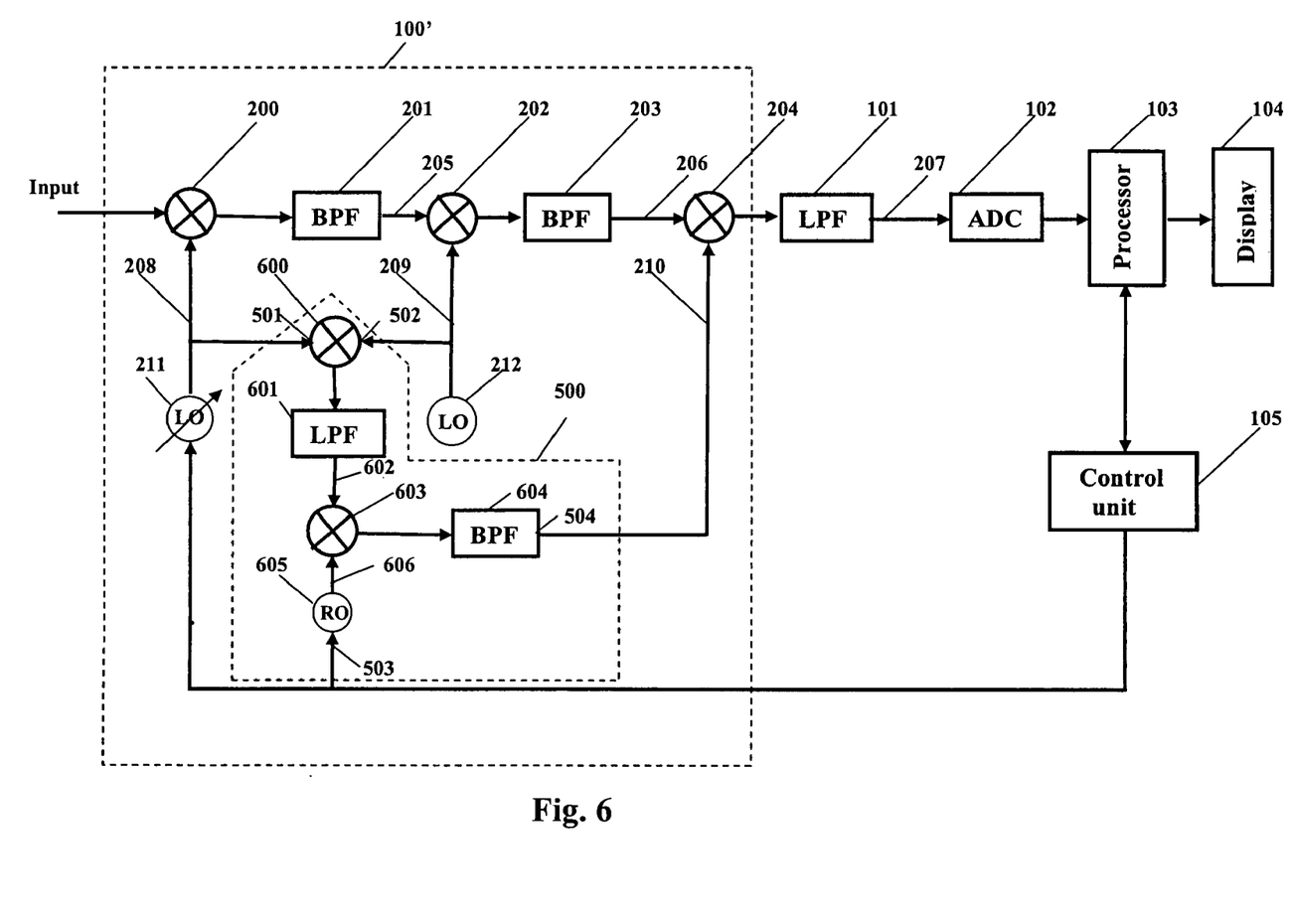
FIG. 6 is a block diagram of a spectrum analyzer according to the present invention, with the inner structure of the phase noise compensation unit being disclosed.

FIG. 6 shows a block diagram of the spectrum analyzer according to the present invention, with the inner structure of the phase noise compensation unit 500 being disclosed in detail. The phase noise compensation unit 500 consists of a fourth mixer 600, a second LPF 601, a fifth mixer 603, a third BPF 604 and a reference (variable frequency) oscillator RO 605. The fourth mixer 600 and the second LPF 601 form a first auxiliary frequency converter. The fifth mixer 603 the third BPF 604 act as a second auxiliary frequency converter.

The first auxiliary frequency converter receives at its inputs 501 and 502 the first local signal 208 and the second local signal 209. The output signal 602 of the first auxiliary frequency converter has a frequency that equals the difference $F_1-F_2$ between frequencies of the first local signals 208 and the second local signal 209. Accordingly, the phase noise of the signal 602 equals the difference $\theta_1(t)-\theta_2(t)$ between the phase noise $\theta_1(t)$ of the first local signal 208 and the phase noise $\theta_2(t)$ of the second local signal 209. Along with the signal 602, the first auxiliary frequency converter produces numerous spurious components.

The reference oscillator 605 is a variable frequency oscillator. At each step of spectrum measurement the control unit 105 sets the frequency Fref of the reference oscillator 605 to equal the start frequency Fst of the frequency band that is analyzed at the current step. The frequency of the reference oscillator is lower than the frequencies of the first and the second local oscillators, and no limitations are imposed on the presence of spurious responses in its output signal, so that its phase noise is sufficiently small.

The inputs of the second auxiliary frequency converter are connected to the output 602 of the first auxiliary frequency converter and to the output 606 of the reference oscillator 605. The frequency of the output signal 504 of the second auxiliary frequency converter equals the difference between the frequency of the signal 602 and the frequency of the reference oscillator 605 and equals $(F_1-F_2)-Fref=((Fst+F_2+F_3)-F_2)-Fst=F_3$. Thus, the frequency of the signal 504 at the output of the second auxiliary frequency converter or, what is the same, at the output of phase noise compensation unit 500 equals the desired frequency of the third local signal. Since the output signal of the reference oscillator is free of phase noise, the phase noise of the signal 504 equals the phase noise of the signal 602. Therefore, the phase noise of the signal 504 equals the difference $\theta_1(t)-\theta_2(t)$ between the phase noise $\theta_1(t)$ of the first local signal 208 and the phase noise $\theta_2(t)$ of the second local signal 209. An important function of the second auxiliary frequency converter is the clearing the output signal 504 from all spurious components.

Figure 7:
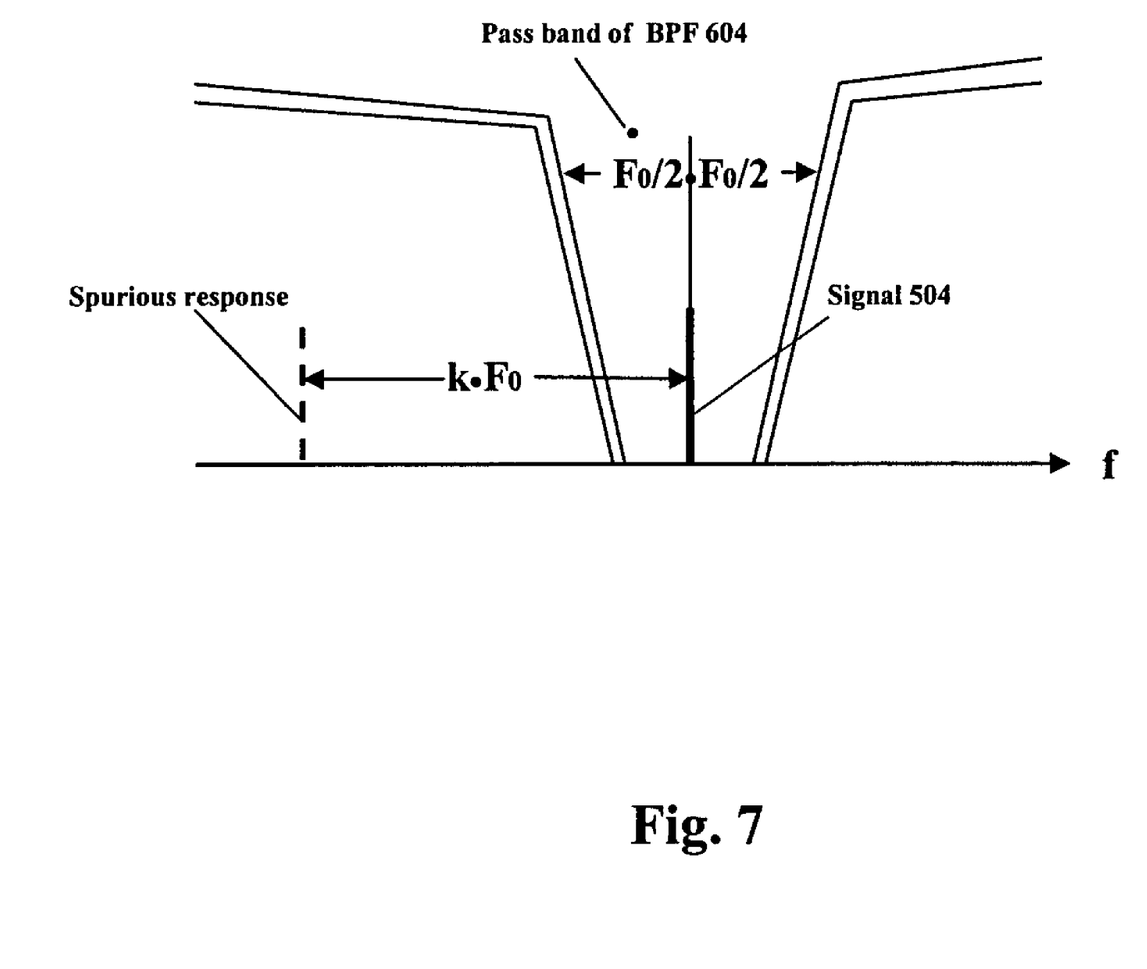
FIG. 7 illustrates the suppression of the spurious responses in a spectrum analyzer according to the present invention.

The third BPF 604 has a bandwidth that is equal to or less than a common divisor $F_0$ of the local oscillators frequencies $F_1$, $F_2$ and the reference oscillator frequency Fref. The frequencies of the spurious components that emerge in the mixers 600 and 603 constitute linear combinations of the frequencies of these mixers input signals. Since the frequencies of the local oscillators and the reference oscillator are multiples of the frequency $F_0$, the frequencies of the mentioned spurious components are multiples of the frequency $F_0$ as well. The situation is illustrated in FIG. 7. The distance between a spurious component and the signal 504 in the frequency domain is $k*F_0$, where k is an integer not less than 1. This distance cannot be less than $F_0$. On the other hand, the third BPF 604 suppresses all components that are farther than $F_0/2$ from the frequency of the signal 504 and are out of the filter pass band. As a result, the third BPF 604 allows passage of the signal 504 and suppresses all spurious responses, so that the signal 504 is free of spurious responses completely.

The present invention may be best understood by way of a specific example. In this example the frequency range of the input signal of the spectrum analyzer is 0 . . . 3000 MHz. The sampling rate of the ADC 102 is 100 MHz. The cutoff frequency of the LPF 101 is accordingly 35 MHz and the spacing between adjacent start frequencies is $\Delta F=25$ MHz. When the spectrum of the input signal is measured step by step, the start frequency Fst takes on values 0, 25 MHz, 50 MHz, . . . , k*25 MHz, . . . , 2975 MHz. The frequency $F_1$ of the first local oscillator is set accordingly as 6500 MHz, 6525 MHz, . . . , 9475 MHz. The frequencies $F_2$ and $F_3$ of the second and the third local signals are fixed and equal 5500 MHz and 1000 MHz respectfully. At each step of the spectrum measurement the relationship $F_1=Fst+F_2+F_3$ is held. The frequency of the signal 602 at the output of the second LPF 601 takes on values $F_1-F_2=1000$ MHz, 1025 MHz, . . . , 3975 MHz. The frequency of the reference oscillator 605 is set at each step by the control unit to be equal to 0, 25 MHz, 50 MHz, . . . , 2975 MHz. The frequency of the signal 504 at the output of the third BPF 604 equals the difference between frequencies of the signal 602 and the reference oscillator 605; this frequency remains fixed at the value 1000 MHz. The third BPF 604 represents a filter with a central frequency 1000 MHz and a bandwidth 25 MHz. Such a filter allows passage of frequencies from 987.5 MHz up to 1012.5 MHz and suppresses all frequencies that are out of this band. It is easy to see that frequencies of all signals in the spectrum analyzer of the cited example are multiples of 25 MHz. For this reason, the frequencies of all spurious components that appear in the mixers 600 and 603 are multiples of 25 MHz as well. The spurious component, which is the closest to the central frequency 1000 MHz of the third BPF 604, may have a frequency 975 MHz or 1025 MHz. But these frequencies lie outside the pass band of the third BPF 604, therefore they (as well as all other spurious components) are suppressed by this filter.

It may happen that the common divisor $F_0$ of the local oscillators frequencies $F_1$, $F_2$ and the reference oscillator frequency Fref is relatively small. The value of the common divisor $F_0$ dictates the bandwidth of the BPF 604. When the common divisor $F_0$ and, accordingly, the bandwidth of the BPF 604 are too small, the required filter selectivity factor increases, and it becomes difficult or impossible to manufacture needed filter.

Figure 8:
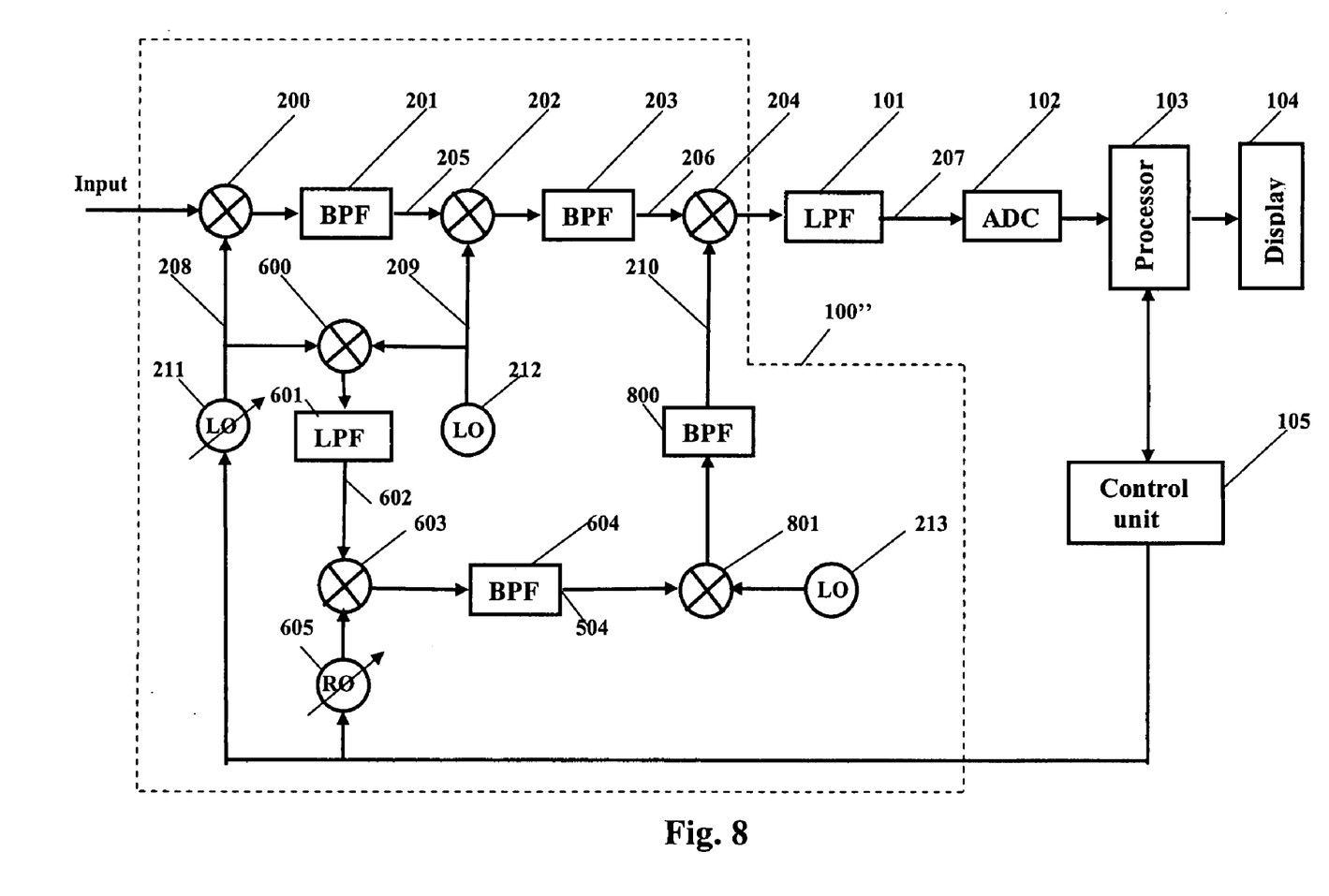
FIG. 8 is a block diagram of a spectrum analyzer according to another embodiment of the present invention.

FIG. 8 shows a block diagram of another embodiment of the present invention. This block diagram includes a frequency converter 110", the purpose of which is to overcome the mentioned difficulty. Here, a third auxiliary frequency converter, that consists of a sixth mixer 801, a forth BPF 800 and the third local oscillator 213, is inserted between the output 504 of the phase noise compensation unit 500 and the input of the third mixer 204. The output 504 of the third BPF 604 and the output of the third local oscillator 213 are connected to the inputs of the mixer 801. The mixer 801 creates at its output signals having both sum and difference frequencies of the input signals. The forth BPF 800 selects the sum product and passes it to the input of the third mixer 204 as the third local signal 210. In this embodiment of the present invention at each measurement step, the control unit 105 sets the frequency Fref of the reference oscillator 605 to be equal to: $Fref=(F_1-F_2)-Foff=Fst+F_3-Foff$. Here, $F_3$ is the desired frequency of the third local signal 210 and Foff is an offset frequency. The offset frequency Foff is chosen as a divisor of the frequency $F_3$. The frequency of the third local oscillator 213 is made equal to $F_3-Foff$. The bandwidth of the forth BPF 800 is equal to or less than the offset frequency Foff.

The frequency of the output signal 504 of the third BPF 604 equals the difference between the frequency of the signal 602 (that equals $F_1-F_2$) and the frequency Fref of the reference oscillator 605. Taking in account the relationships $F_1=Fst+F_2+F_3$ and $Fref=Fst+F_3-Foff$, it is easy to see, that the frequency of the output signal 504 of the third BPF 604 equals $(F_1-F_2)-Fref=((Fst+F_2+F_3)-F_2)-(Fst+F_3-Foff) =Foff$. Therefore, the third BPF 604 has a central frequency Foff and bandwidth $F_0$; its filter selectivity factor equals Foff/$F_0$. By choosing the proper value of the offset frequency Foff the ratio Foff/$F_0$ may be reduced in an arbitrary way, so that the manufacturing of the third BPF 604 does not present any difficulties. As before, the output signal 504 of the third BPF 604 has a phase noise $\theta_1(t)-\theta_2(t)$ and is free of any spurious components During mixing process in the sixth mixer 801, some new spurious components emerge. The frequencies of these spurious components constitute linear combinations of the frequency Foff of the signal 504 and the frequency $F_3$-Foff of the third local oscillator 213. Since the frequencies $F_3$ and $F_3$-Foff are multiples of the frequency Foff, the frequencies of the spurious components appearing in the sixth mixer 901 are multiples of the frequency Foff as well. The distance between a spurious component and the signal 210 is k* Foff, where k is an integer not less than 1. This distance cannot be less than Foff. On the other hand, the bandwidth of the forth BPF 800 is equal to or less than the offset frequency Foff. Accordingly, the forth BPF 800 suppresses all components that are farther than Foff/2 from the signal 210 and are out of the filter pass band. As a result, the forth BPF 800 allows passage of the signal 210 and suppresses all spurious responses that appeared in the sixth mixer 801.

The frequency of the third local oscillator 213 is much less than the frequencies of the first and the second local oscillators, therefore it has essentially zero phase noise. For this reason, the phase noise in the third local signal 210 is the same as in the signal 504 and equals $\theta_1(t)-\theta_2(t)$.

The frequency of the signal 210 equals the sum of the frequency Foff of the signal 504 and the frequency $F_3$-Foff of the third local oscillator 213 and equals Foff+($F_3$-Foff) =$F_3$. Besides, as it was just mentioned, the signal 210 has a phase noise $\theta_1(t)-\theta_2(t)$ and is free of spurious responses completely. Thus, the block diagram of FIG. 8 furnishes all necessary features of the third local signal 210 alleviating at the same time the requirements to the third BPF 604.

Figure 9:
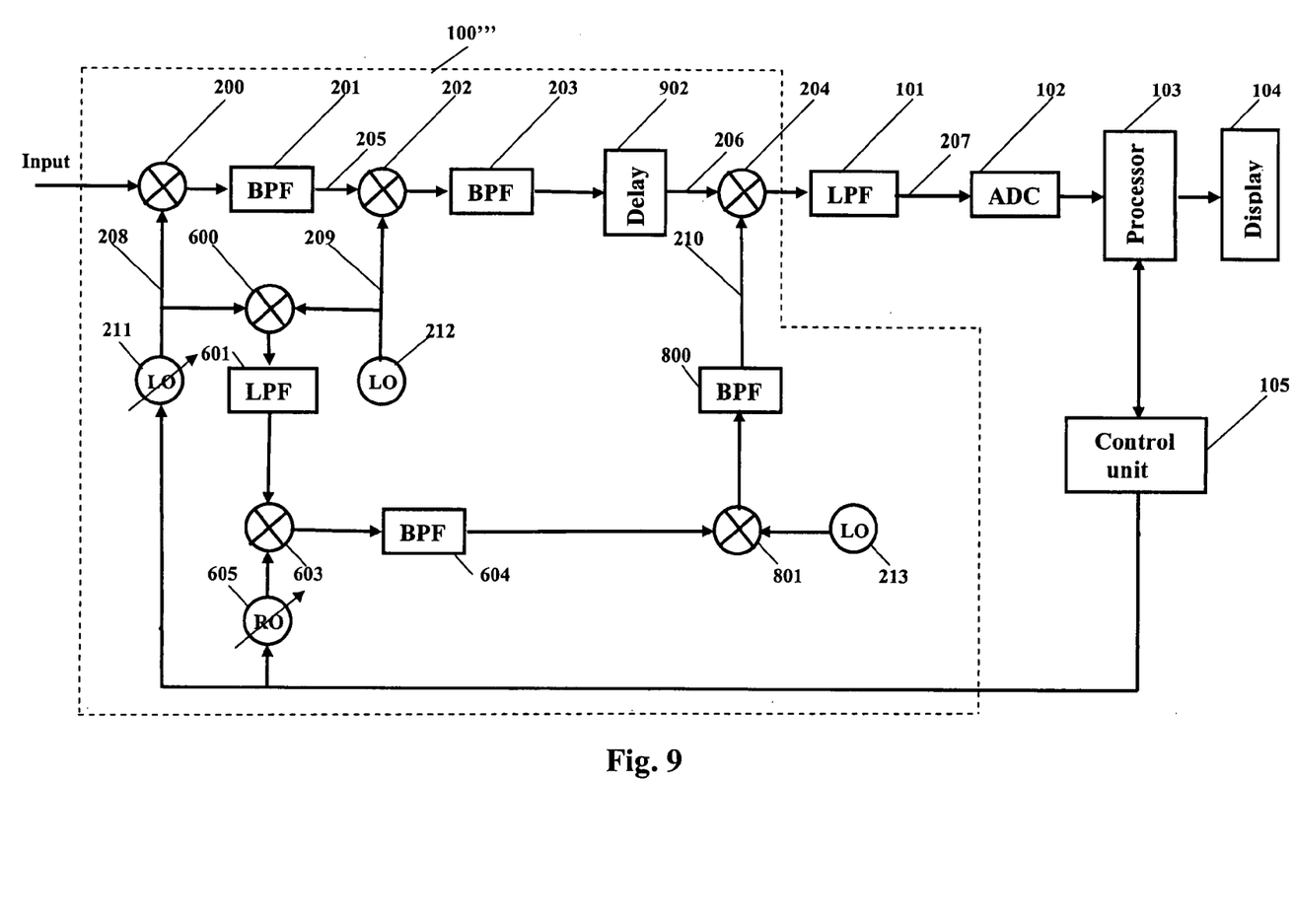
FIG. 9 is a block diagram of a spectrum analyzer according to yet another embodiment of the present invention.

FIG. 9 shows a block diagram of yet another embodiment of the present invention, including a frequency converter 100''', the purpose of which is to eliminate a possibility of incomplete phase noise compensation. The bandwidth of the third BPF 604 may be narrower than bandwidth of the second BPF 203. Because of it, the time delay of BPF 604 may exceed considerably the time delay of BPF 203. The same phase noise comes to the third mixer 204 through two routes: through BPF 203 and through BPF 604. If the delays in these two routes are different, then the mutual cancellation of the phase noises in the third mixer 204 is not complete, and residual phase noise penetrates into the signal 207 at ADC input. To prevent an appearance of such residual phase noise a proper delay line 902 is inserted between the output of the second BPF 203 and the input of the third mixer 204.

A number of implementations of the present invention were described above. It should be apparent to those skilled in the art that various modifications are possible without departing from the principles of the present invention. Accordingly, such modifications are understood to be within the scope of the following claims.

What is claimed is:

1. A spectrum analyzer comprising: (a) A frequency converter that includes: a first conversion stage formed of a first mixer, a first band pass filter and a first local oscillator; a second conversion stage formed of a second mixer, a second band pass filter and a second local oscillator; a third conversion stage formed of a third mixer; (b) A control unit that regulates the sequence and parameters of operations during the spectrum measurements; and (c) A phase noise compensation unit that has two signal inputs connected to the outputs of the first and the second local oscillators, a control input connected to the output of the control unit, and an output connected to the input of the third mixer wherein the phase noise compensation unit comprises: (a) A first auxiliary frequency converter for producing a signal with a phase noise that equals the difference between the phase noise of the first local oscillator and the phase noise of the second local oscillator, said first auxiliary frequency converter having two inputs that are used as the signal inputs of the phase noise compensation unit, and an output; (b) A reference oscillator for generating a reference signal, said reference oscillator having a control input that is used as the control input of the phase noise compensation unit, and an output; (c) A second auxiliary frequency converter for producing the third local signal, said second auxiliary frequency converter having two inputs connected to the outputs of the first auxiliary frequency converter and the reference oscillator, and an output that is used as the output of the phase noise compensation unit.

2. A spectrum analyzer of claim 1, wherein the first auxiliary frequency converter comprises: (a) A mixer for mixing the two input signals, said mixer having two inputs that are used as inputs of the first auxiliary frequency converter, and an output; (b) A low pass filter for separating out the difference product of the mixing, said low pass filter having an input connected to the output of the mixer, and an output that is used as the output of the first auxiliary frequency converter.

3. A spectrum analyzer of claim 2, wherein the second auxiliary frequency converter comprises: (a) A mixer for mixing the two input signals, said mixer having two inputs that are used as inputs of the second auxiliary frequency converter, and an output; (b) A band pass filter for separating out the difference product of the mixing, said band pass filter having an input connected to the output of the mixer, and an output that is used as the output of the second auxiliary frequency converter.

4. A spectrum analyzer of claim 3, wherein said control unit is configured to set the frequency of the reference oscillator to equal the start frequency of the frequency band that is analyzed at the current step of the spectrum measurement.

5. A spectrum analyzer of claim 4, wherein the band pass filter of the second auxiliary frequency converter is configured to have a bandwidth that is equal to or less than a common divisor of the frequencies of the local oscillators and the start frequencies.

6. A spectrum analyzer of claim 1, wherein a third auxiliary frequency converter is inserted between the output of the phase noise compensation unit and the input of the third mixer of the frequency converter.

7. A spectrum analyzer of claim 6, wherein the third auxiliary frequency converter comprises: (a) A mixer for mixing the two input signals, said mixer having two inputs, first of which is used as the input of the third auxiliary frequency converter, and an output; (b) A band pass filter for separating out the sum product of the mixing, said band pass filter having an input that is connected to the output of the mixer, and an output that is used as the output of the third auxiliary frequency converter; (c) A third local oscillator with an output connected to the second input of the mixer.

8. A spectrum analyzer of claim 1, wherein said control unit is configured to set the frequency of the reference oscillator to equal the sum of the start frequency of the frequency band that is analyzed at the current step of the measurement and the difference between the desired frequency of the third local signal and an offset frequency.

9. A spectrum analyzer of claim 8, wherein said control unit is configured to use as the offset frequency a divisor of the desired frequency of the third local signal.

10. A spectrum analyzer of claim 8, wherein said band pass filter of the third auxiliary frequency converter is configured to have a bandwidth that is equal to or less than the offset frequency.

11. A spectrum analyzer of claim 8, wherein said third local oscillator is configured to produce a sine wave with a frequency equal to the difference between the desired frequency of the third local signal and the offset frequency.

12. A spectrum analyzer of claim 5 or 11, wherein for prevention of incomplete compensation of the phase noise a delay line is inserted in the processing signal path of the frequency converter between the second and the third stages of conversion.

\* \* \* \* \*